US011659731B2

(12) United States Patent
Lei et al.

(10) Patent No.: US 11,659,731 B2
(45) Date of Patent: May 23, 2023

(54) INTEGRATED LIGHT-EMITTING DEVICE AND FABRICATING METHOD THEREOF

(71) Applicant: TCL Technology Group Corporation, Huizhou (CN)

(72) Inventors: Hui Lei, Huizhou (CN); Weiran Cao, Huizhou (CN); Lei Qian, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 0 days.

(21) Appl. No.: 16/976,314

(22) PCT Filed: Jul. 24, 2019

(86) PCT No.: PCT/CN2019/097492
§ 371 (c)(1),
(2) Date: Aug. 27, 2020

(87) PCT Pub. No.: WO2020/020223
PCT Pub. Date: Jan. 30, 2020

(65) Prior Publication Data
US 2021/0175474 A1    Jun. 10, 2021

(30) Foreign Application Priority Data
Jul. 25, 2018   (CN) .......................... 201810826539.0

(51) Int. Cl.
*H01L 51/52*       (2006.01)
*H01L 51/00*       (2006.01)
(Continued)

(52) U.S. Cl.
CPC ...... *H01L 51/5271* (2013.01); *H01L 51/0037* (2013.01); *H01L 51/5064* (2013.01);
(Continued)

(58) Field of Classification Search
CPC ............. H01L 51/5271; H01L 51/5064; H01L 51/5215; H01L 51/5234
See application file for complete search history.

(56) References Cited

U.S. PATENT DOCUMENTS

2011/0114931 A1   5/2011   Lee et al.
2016/0293892 A1  10/2016   Yamae et al.

FOREIGN PATENT DOCUMENTS

CN    102097597 A    6/2011
CN    205985074 U    2/2017
(Continued)

OTHER PUBLICATIONS

Machine Translation of CN 109980116.*
(Continued)

*Primary Examiner* — Anthony Ho
(74) *Attorney, Agent, or Firm* — Cantor Colburn LLP

(57) ABSTRACT

An integrated light-emitting device and a fabricating method thereof. The integrated light-emitting device includes a first electrode, an insulating layer, a second electrode, a light-emitting layer, and a third electrode which are sequentially laminated; the first electrode, the insulating layer, the second electrode, and the third electrode together constitute a field effect transistor unit, and the first electrode, the second electrode and the third electrode are respectively a gate, a source and a drain of the field effect transistor unit, and a surface of the insulating layer adjacent to the second electrode is provided with a nano-pit array structure configured for condensing light; and the second electrode, the light-emitting layer and the third electrode together constitute a light-emitting unit, the light-emitting unit configured to emit light toward the first electrode along the second electrode.

20 Claims, 4 Drawing Sheets

(51) Int. Cl.
*H01L 51/50* (2006.01)
*H01L 51/56* (2006.01)

(52) U.S. Cl.
CPC ...... *H01L 51/5215* (2013.01); *H01L 51/5234* (2013.01); *H01L 51/56* (2013.01); *H01L 2251/5369* (2013.01)

(56) References Cited

FOREIGN PATENT DOCUMENTS

| CN | 106711177 A | 5/2017 |
| CN | 109980116 A | 7/2019 |
| KR | 20130129665 A | 11/2013 |

OTHER PUBLICATIONS

English Translation to International Search Report for Application No. PCT/CN2019/097492.
International Search Report for Application No. PCT/CN2019/097492.
Written Opinion for Application No. PCT/CN2019/097492.

* cited by examiner

INTEGRATED LIGHT-EMITTING DEVICE AND FABRICATING METHOD THEREOF

CROSS REFERENCE TO RELATED APPLICATIONS

This application is a National Stage Appl. filed under 35 USC 371 of International Patent Application No. PCT/CN2019/097492 with an international filing date of Jul. 24, 2019, designating the United States, and further claims foreign priority benefits to Chinese Patent Application No. 201810826539.0 filed on Jul. 25, 2018. The contents of all of the aforementioned applications, including any intervening amendments thereto, are incorporated herein by reference.

TECHNICAL FIELD

The present application relates to a field of display technology, and more particularly to an integrated light-emitting device and a fabricating method thereof.

BACKGROUND

In recent years, Quantum Dot Light-emitting Diode (QLED) and Organic Light-Emitting Diode (OLED) having many advantages in lighting and display field due to their high brightness, low power consumption, wide color gamut, and easy to be produced have received extensive attention and research. Compared to OLED, the energy saving of QLED is expected to be twice that of OLED under a same picture quality, and the luminous efficiency thereof will be increased by 30% to 40%. In addition, QLED has the advantages that the start-up voltage is low, half width of photoluminescence spectrum is narrow, emission wavelength and color can be adjusted by quantum dot particle size, and the cost of fabricating solution is low, and which has huge application potential in the field of solid-state lighting and display. In addition, in the context of the development of microelectronics technology, Field Effect Transistor (FET) is one of the most widely used devices in modern microelectronics. There have been reports in the literature that integrates FET with organic light-emitting device, such that FET is used as driving units for panel displays, and source and drain current is controlled by the transistor gate voltage to control the device to emit light.

High-performance light-emitting field-effect transistors require that the gate insulating layer has good insulation and capacitance properties, as well as better device structure and performance, such as, Organic Field Effect Transistor (OFET). The mainstream OFET manufacturing technology includes vacuum thin film deposition technology represented by thermal evaporation and sputtering, which has the advantages of high film formation uniformity, controllable thickness, and relatively high field effect mobility. Although the light-emitting efficiency of the QLED device has made a big breakthrough, it is still limited by the mode limitations of the waveguide mode and the surface plasma mode, and the light extraction rate of the light-emitting device is still low. Therefore, improving the light extraction rate has become an important part of improving light-emitting performance of the device.

At present, the common methods used to improve the light extraction rate of the device include methods of controlling a thickness of the device by microcavity effect, setting the Bragg reflector and photonic crystal structure, however, these methods are not ideal in improving the effect of light extraction rate of the device, and the prior art needs improvement.

Technical Problem

An object of the present application is to overcome above-mentioned shortcomings of the prior art, and to provide an integrated light-emitting device and a fabricating method thereof, in order to solve the technical problem that the light-emitting efficiency of the existing light-emitting device is not ideal.

Technical Solutions

In order to achieve the object above-mentioned, the technical solution adopted in the present application as follows:

In an aspect of the present application provides an integrated light-emitting device, including: a first electrode, an insulating layer, a second electrode, a light-emitting layer, and a third electrode which are sequentially laminated;

the first electrode, the insulating layer, the second electrode, and the third electrode together constitute a field effect transistor unit, and the first electrode, the second electrode and the third electrode are respectively a gate, a source and a drain of the field effect transistor unit, and a surface of the insulating layer adjacent to the second electrode is provided with a nano-pit array structure configured for condensing light; and the second electrode, the light-emitting layer and the third electrode together constitute a light-emitting unit, the light-emitting unit being configured to emit light toward the first electrode along the second electrode.

In another aspect of the present application provides a method for manufacturing an integrated light-emitting device, including following steps:

providing a substrate and fabricating a first electrode on the substrate;

fabricating an insulating layer on the first electrode;

fabricating a nano-pit array structure for condensing light on a surface of the insulating layer;

fabricating a second electrode on the insulating layer;

fabricating a light-emitting layer on the second electrode; and fabricating a third electrode on the light-emitting layer;

the first electrode, the insulating layer, the second electrode and the third electrode together constitute a field effect transistor unit, and the second electrode, the light-emitting layer and the third electrode together constitute a light-emitting unit.

Beneficial Effect

The integrated light-emitting device provided by the present application is a capacitor-driven light-emitting integrated device, which includes a field-effect transistor unit composed of a first electrode, an insulating layer, a second electrode and a third electrode, and a light-emitting unit composed of the second electrode, a light-emitting layer and the third electrode. Compared with the prior art, a surface of the insulating layer in the field-effect transistor unit adjacent to the second electrode is provided with a nano-pit array structure, such that when light-emitting unit emits light toward the first electrode, the incident light enters the nano-pit array structure, and the nano-pit array structure has a light-condensing effect equivalent to a lens, which can reduce an incident angle of the incident light, thereby reducing total reflection, therefore the nano-pit array structure is convenient to reduce the loss of the incident light of the light emitting unit due to the total reflection occurs, thereby the light extraction efficiency of the integrated light-emitting device is enhanced.

The fabricating method of an integrated light-emitting device provided by the present application has a simple process. In the fabricating processes of the integrated light-emitting device, a nano-pit array structure configured for condensing light is fabricated on a surface of the insulating layer adjacent to the second electrode, and the nano-pit array structure has a light-condensing effect equivalent to a lens, which can reduce an incident angle of the incident light, thereby reducing total reflection, therefore the nano-pit array structure is convenient to reduce the loss of the incident light of the light emitting unit due to the total reflection occurs, thereby the light extraction efficiency of the integrated light-emitting device is enhanced.

DETAILED DESCRIPTION

Figure 1:
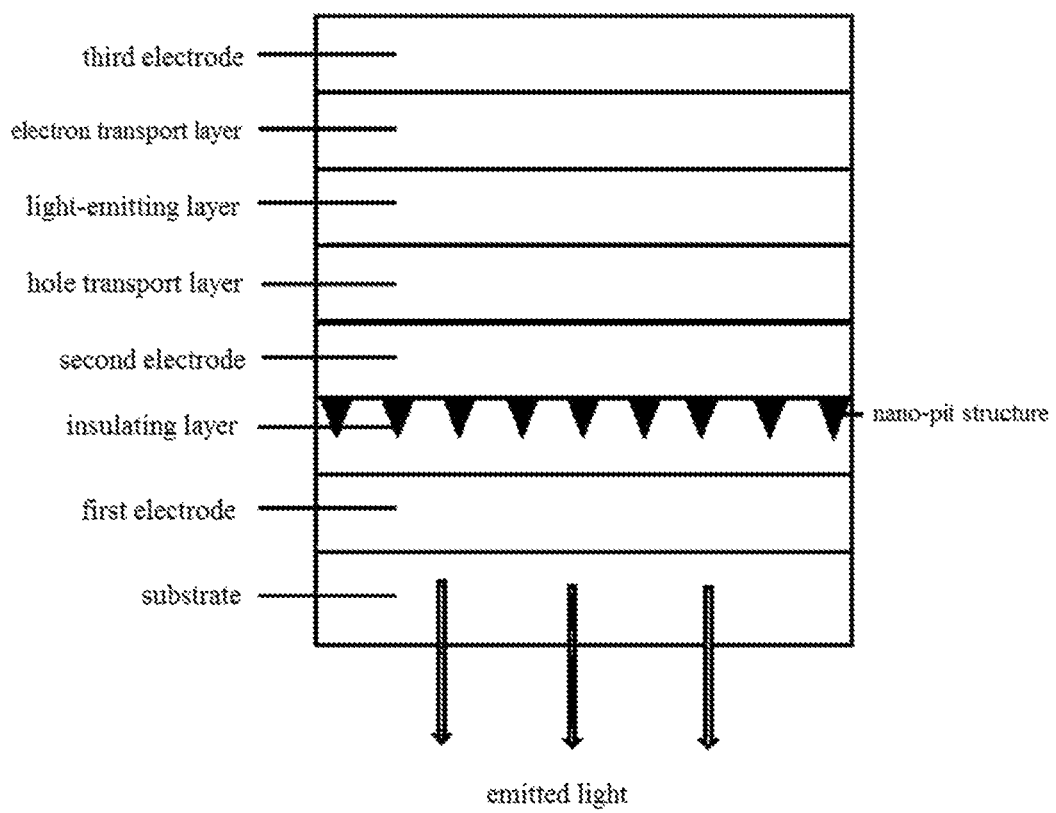
FIG. 1 is a structural schematic view of an integrated light-emitting device of the present application.

In order to make the technical problems, technical solutions and beneficial effects to be solved by the present application more clear, the present application will be further described in detail below in conjunction with the drawings and embodiments. It should be understood that the specific embodiments described herein are only used to explain the present application, and are not intended to limit the present application.

It should be understood that the terms "first", "second", and "third" in the embodiments of the present application are for descriptive purposes only, and cannot be understood as indicating or implying relative importance or implicitly indicating the indicated the number of technical features. Thus, features defined as "first", "second", and "third" may explicitly or implicitly include one or more of the features.

In an aspect, the present application provides an integrated light-emitting device, including: a first electrode, an insulating layer, a second electrode, a light-emitting layer, and a third electrode which are sequentially laminated;

a field effect transistor unit is composed of the first electrode, the insulating layer, the second electrode, and the third electrode, and the first electrode, the second electrode and the third electrode are respectively a gate, a source and a drain of the field effect transistor unit, and a surface of the insulating layer adjacent to the second electrode is provided with a nano-pit array structure configured for condensing light; and a light-emitting unit is composed of the second electrode, the light-emitting layer and the third electrode, and the light-emitting unit emits light toward the first electrode along the second electrode.

The integrated light-emitting device provided by the present application is a capacitor-driven light-emitting integrated device, which includes a field-effect transistor unit composed of a first electrode, an insulating layer, a second electrode and a third electrode, and a light-emitting unit composed of the second electrode, a light-emitting layer and the third electrode. Compared with the prior art, a surface of the insulating layer in the field-effect transistor unit adjacent to the second electrode is provided with a nano-pit array structure, such that when light-emitting unit emits light toward the first electrode, the incident light enters the nano-pit array structure, and the nano-pit array structure has a light-condensing effect equivalent to a lens, which can reduce an incident angle of the incident light, thereby reducing total reflection, therefore the nano-pit array structure is convenient to reduce the loss of the incident light of the light emitting unit due to the total reflection occurs, thereby the light extraction efficiency of the integrated light-emitting device is enhanced.

Further, in an embodiment of the integrated light-emitting device provided by the present application, the nano-pit array structure is an ordered structure composed of nano-pits of a same size; or the nano-pit array structure is a disordered structure composed of nano-pits with different sizes.

Further, in an embodiment of the integrated light-emitting device provided by the present application, a distribution density of nano-pits in the nano-pit array structure ranges from 1-100 per $\mu m^2$. Within this distribution density ranges, the nano-pit array structure has a better light-condensing effect.

Further, in an embodiment of the integrated light-emitting device provided by the present application, the second electrode is an anode, the third electrode is a cathode, and a hole functional layer is laminated between the second electrode and the light-emitting layer; such as a hole transport layer or a hole injection layer and a hole transport layer which are sequentially laminated; and/or an electron functional layer is laminated between the light-emitting layer and the third electrode, such as an electron transport layer or an electron transport layer and an electron injection layer which are sequentially laminated. When the second electrode is an anode, and the third electrode is a cathode, the corresponding first electrode is a cathode.

In another integrated light-emitting device provided by an embodiment of the present application, the second electrode is a cathode, the third electrode is an anode, and an electron functional layer is laminated between the second electrode and the light-emitting layer, such as an electron transport layer or an electron injection layer and an electron transport layer which are sequentially laminated; and/or a hole functional layer is laminated between the light-emitting layer and the third electrode, such as a hole transport layer or a hole transport layer and a hole injection layer which are sequentially laminated. When the second electrode is a cathode, and the third electrode is an anode, the corresponding first electrode is an anode.

Among then, the electron transport layer is preferably n-type zinc oxide with high electron transport performance, and its preferred thickness is 30-60 nm. The material of the electron injection layer can be selected from metals with low work function, such as, Calcium (Ca), Barium (Ba), etc., or selected from compounds, such as, Cesium Fluoride (CsF), Lithium Fluoride (LiF), Cesium carbonate ($CsCO_3$), etc., and other electrolyte-type electron transport layer materials. The hole injection layer and the hole transport layer can be selected according to actual needs, such as PEDOT: PSS, TFB, etc., with a thickness of 0-100 nm, preferably 40-50 nm.

The material of the second electrode may be Argentum (Ag) nanowire or Ag nanosilver ink or a combination of both, and some metal oxides include: Indium Gallium Zinc Oxide (IGZO)/Zinc Oxide (ZnO)/Indium Zinc Oxide (IZO)/WOx/VOx/Nickel Oxide(cas) (NiOx)/Cupric Oxide (CuO) and so on. If the third electrode is an anode, which can select high work function materials such as Indium Tin Oxide (ITO), Aurum (Au), Platinum (Pt), Chromium (Cr) and some alloys. If the third electrode is a cathode, low work function materials such as Aluminium (Al), Ag, Nickel (Ni), etc. can be selected.

Further, in an embodiment of the integrated light-emitting device provided by the present application, the light-emitting layer is a quantum dot light-emitting layer or an organic light-emitting layer. That is, in the integrated light-emitting device, the integrated light-emitting unit can be QLED or OLED.

Further, the insulating layer is an Aluminium Oxide ($Al_2O_3$)layer, that is the insulating layer is a single $Al_2O_3$ layer. In order to be suitable for flexible light-emitting devices, the insulating layer is preferably composed of a Polyimide (PI) layer and an $Al_2O_3$ layer which are laminated. The PI/$Al_2O_3$ multilayer insulating layer structure can make full use of the flexibility and light transmission characteristics of PI, such a flexible insulating layer can be better applied to flexible light emitting devices.

As shown in FIG. 1, illustrating a structural schematic view of a preferred integrated light-emitting device according to an embodiment of the present application, including from bottom to top: a substrate, a first electrode, an insulating layer, a second electrode, a hole transport layer, and a light-emitting layer, an electron transport layer and a third electrode; a surface of the insulating layer adjacent to the second electrode is provided with a nano-pit array structure configured for condensing light. The second electrode, the light-emitting layer and the third electrode consist of a light-emitting unit that emits light vertically downward. The nano-pit array structure on the surface of the insulating layer is beneficial to reduce the loss caused by total reflection of the incident light from the light-emitting unit at an interface of the substrate. Therefore the light extraction rate of the device is enhanced.

Figure 2:
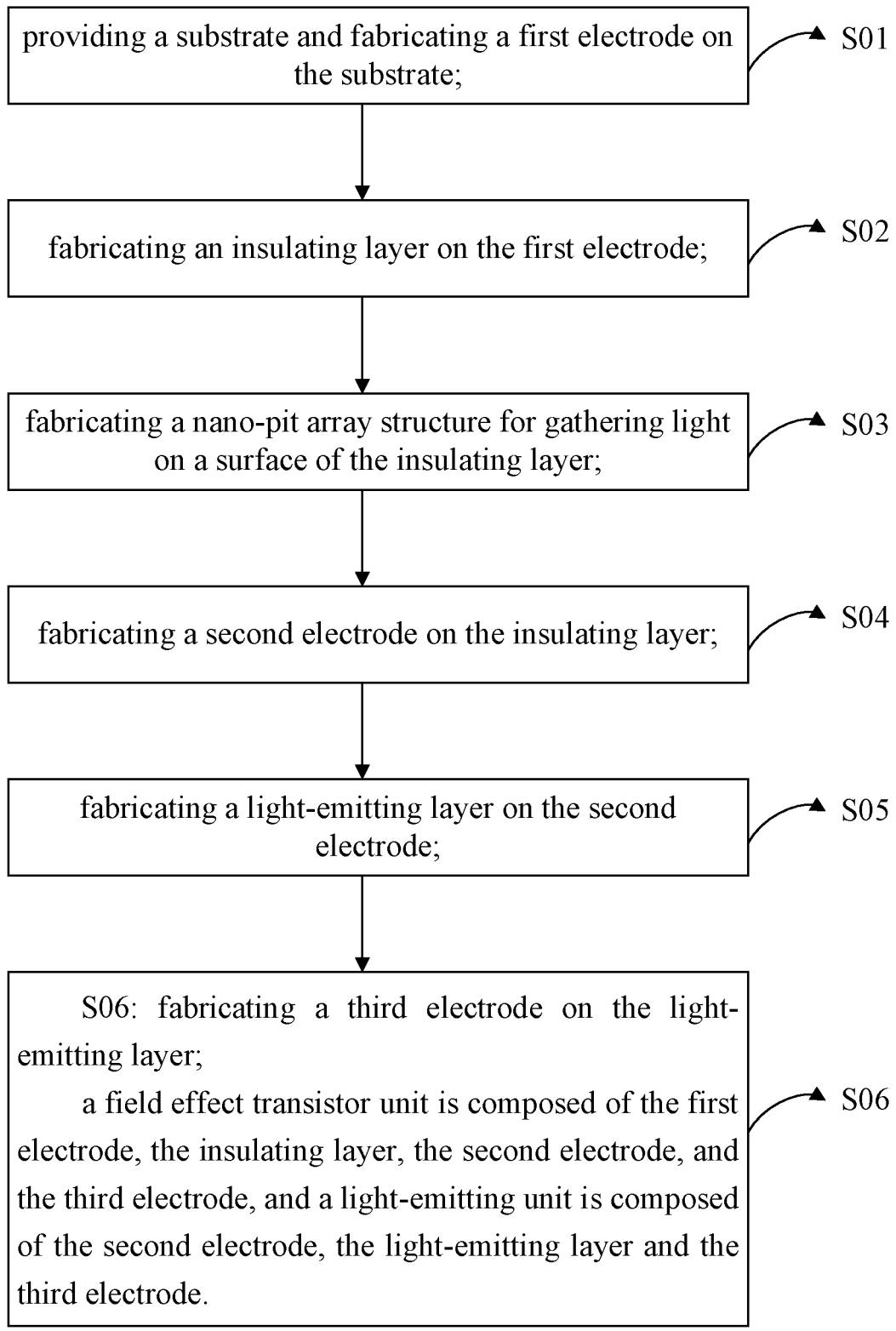
FIG. 2 is a flow chart of a fabricating method of an integrated light-emitting device of the present application.

In another aspect, the present application further provides a fabricating method of an integrated light-emitting device, as shown in FIG. 2, the fabricating method includes the following steps:

S01: providing a substrate and fabricating a first electrode on the substrate;

S02: fabricating an insulating layer on the first electrode;

S03: fabricating a nano-pit array structure for condensing light on a surface of the insulating layer;

S04: fabricating a second electrode on the insulating layer;

S05: fabricating a light-emitting layer on the second electrode; and

S06: fabricating a third electrode on the light-emitting layer;

a field effect transistor unit is composed of the first electrode, the insulating layer, the second electrode, and the third electrode, and a light-emitting unit is composed of the second electrode, the light-emitting layer and the third electrode.

The fabricating method of an integrated light-emitting device provided by the present application has a simple process. In the fabricating processes of the integrated light-emitting device, a nano-pit array structure configured for condensing light is fabricated on a surface of the insulating layer adjacent to the second electrode, and the nano-pit array structure has a light-condensing effect equivalent to a lens, which can reduce an incident angle of the incident light, thereby reducing total reflection, therefore the nano-pit array structure is convenient to reduce the loss of the incident light of the light emitting unit due to the total reflection occurs, thereby the light extraction efficiency of the integrated light-emitting device is enhanced.

Further, in above-mentioned step S02: the step of fabricating an insulating layer on the first electrode includes:

the step of fabricating an insulating layer on the first electrode comprises: depositing a Polyimide solution on the first electrode and performing a first annealing process to obtain a PI layer, then depositing an $Al_2O_3$ precursor solution on the PI layer and performing a second annealing process to obtain an $Al_2O_3$ layer, that is, the PI layer and the $Al_2O_3$ layer which are laminated form the insulating layer. Specifically, the PI and N, N-Dimethylformamide (DMF) are diluted at a volume ratio of 1:1, then spin-coating on the first electrode, then annealing processing at 200-250° C. to obtain the PI layer, finally depositing the $Al_2O_3$ precursor solution on the PI layer and annealing processing at 200-250° C. to form the $Al_2O_3$ layer; a multilayer insulating layer structure composed of the PI layer and the $Al_2O_3$ layer is fully using the characteristics of PI flexibility and light transmission, it can be better applied to flexible light-emitting devices.

Of course, the $Al_2O_3$ precursor solution may also be directly deposited on the first electrode, and performing a second annealing process to obtain the $Al_2O_3$ layer, that is, a single-layer $Al_2O_3$ layer is directly fabricated as the insulating layer. Specifically, firstly depositing the $Al_2O_3$ precursor solution on the first electrode, and then performing annealing process at 200-300° C. to form the $Al_2O_3$ layer.

Further, in above-mentioned step S03:

the step of fabricating a nano-pit array structure on the surface of the insulating layer includes:

S031: fabricating a Polystyrene nanosphere solution, and depositing the Polystyrene nanosphere solution on a surface of the insulating layer to obtain a single layer of Polystyrene nanospheres;

S032: depositing a Perhydropolysilazane (PHPS) solution on the single-layer Polystyrene nanospheres such that the PHPS solution is immersed in gaps of the single-layer Polystyrene nanospheres, and then performing a third annealing process to volatilize the single-layer Polystyrene nanospheres to obtain a $SiO_2$ film;

S033: performing an etching process to the insulating layer using the $SiO_2$ film as a mask, such that the nano-pit array structure is formed on the surface of the insulating layer.

In the embodiment of the present application, the nano-pit array structure is fabricated on the surface of the insulating layer by a simple and efficient solution method, and the fabricating method of the nano-pit array structure can effectively avoid the mutual influence factors of different solvents in the prior art nanospheres and $SiO_2$ precursor mixed film forming method.

Further, in above-mentioned step S031: the single-layer PS nanospheres is Polystyrene nanospheres layer, and the Polystyrene nanospheres are rehearsed in a hexagonal close-packed shape. Specifically, the PS nanosphere-deionized water/ethanol suspension liquid may be selected to form a single-layer PS nanosphere thin film on the surface of the insulating layer through a liquid-gas interface self-organizing method, a spin-coating method, or the like. Among them, the PS nanosphere solution can select the PS nanospheres with a diameter ranges from 100-1000 nm. The PS nanospheres are mixed with deionized water (or deionized water+ethanol) to prepare a mass concentration of 0.2~5%. During this step, the PS nanospheres can select a single diameter to fabricate ordered microstructures, or multiple diameter nanospheres to fabricate disordered microstructures.

Further, in above-mentioned step S032: prior to the step of depositing the PHPS solution on the single-layer PS nanospheres, the method further includes: performing a Reactive Ion Etching (RIE) etching process on the single-layer PS nanospheres; the RIE etching process can reduce the size of the PS nanospheres to increase gaps between the nanospheres; specifically, using $O_2$ as the etching gas, and the gas flow rate ranges from 5-100 sccm, then the etching is performed at power of 1-100 W for 1-500 s.

Furthermore, the step of the third annealing process further includes: performing a ultraviolet ozone process in a gaseous environment of ammonia gas and hydrogen peroxide; in order to promote the hydrolysis, condensation and solidification of PHPS, specifically, during the third annealing process, the environment can be set to a humid environment rich in water vapor, ammonia, and $H_2O_2$ and ultraviolet ozone cleaner (UVO) treatment to improve the efficiency of PHPS curing. The third annealing process volatilizes the single-layer PS nanospheres, and the final $SiO_2$ film has a complementary surface that fits into the gap of the single-layer PS nanospheres. After the step of the third annealing process, the method further includes: a ultrasonic processing or an immersion processing with tetrahydrofuran solution to remove residual PS nanospheres.

Further, the third annealing process includes: annealing at 50-100° C. for 1-60 min, then annealing at 100-250° C. for 0.2-3 h. Firstly, the formed coating is annealed at 50-100° C. for 1-60 min, this process mainly promotes the preliminary reaction of PHPS and promotes the evaporation of the solvent. Then it is annealed at 100-250° C. for 0.2~3 h, this process mainly promotes the further condensation and hydrolysis of PHPS to form $SiO_2$ film, and promotes the volatilization of PS nanospheres under high temperature conditions to form nano-microstructures. The $SiO_2$ film is a hexagonal close-packed $SiO_2$ film left on the insulating layer, and has a surface structure that fits into the gaps of the single-layer PS nanospheres.

The preparation of the above PHPS solution includes: mixing PHPS with ether under the protection of a dry nitrogen atmosphere, and fully dissolving PHPS through magnetic stirring to obtain the PHPS solution, and the mass concentration of PHPS in the PHPS solution ranges from 1-10%.

Further, in above-mentioned step S033: the etching process includes: using the $SiO_2$ film as a mask, etching a bare material on the surface of the insulating layer with a first acidic solvent, and then removing the $SiO_2$ film with a second acidic solvent. For example, the insulating layer is etched in an acidic solvent (such as $H_2SO_4$ solution, etc.). The area covered by the PS nanospheres is the bare $Al_2O_3$ on the surface of the insulating layer, which can generate the nano-pit array structure during the reaction with the acidic solvents, the etched insulating layer is soaked or rinsed in HF acid to remove the remaining $SiO_2$ film.

The present application has been tested multiple times in succession, and a part of the test results will now be used as a reference to describe the present application in further detail. The following detailed description will be made in conjunction with specific embodiments.

Embodiment 1

A fabricating method of a vertical light-emitting field effect transistor includes the following steps:

S11: fabricating a first electrode on a transparent substrate, the first electrode may be a transparent material such as ITO, the first electrode is a gate of a field effect transistor (FET), and the first electrode can select an anode;

S12: fabricating an insulating layer on the first electrode, and the material of the insulating layer is required to be light-permeable. The fabricating method thereof selects solution fabricating method, which includes the following steps:

S121: selecting $Al_2O_3$ precursor solution by using solution preparation methods such as spin coating method and printing method. The process conditions for the spin coating fabricating are: spin coating speed is 500-8000 rpm, preferably 5000 rpm; spin coating time is 10-60 s, preferably 30 s. The process conditions of the inkjet printing method are: a distance between a nozzle and the substrate is 5 mm, and a voltage of the nozzle is set to 5-20 V. The annealing process temperature ranges from 0~300° C. and the annealing time ranges from 1~30 min after film formation to form the $Al_2O_3$ insulating layer.

Alternatively, S121: fabricating a multi-layer insulating layer structure according to the actual needs, such as, fabricating a PI/$Al_2O_3$ insulating layer structure on a flexible substrate, among then, the fabricating method of the PI insulating layer is diluting the PI and DMF according to the volume ratio of 1:1, then spin coating onto the first electrode, and then drying in an infrared box for 5 minutes, and then performing a annealing process for 3 hours under argon atmosphere and 220° C. Finally fabricating the $Al_2O_3$ insulating layer on the PI layer.

Figure 3:
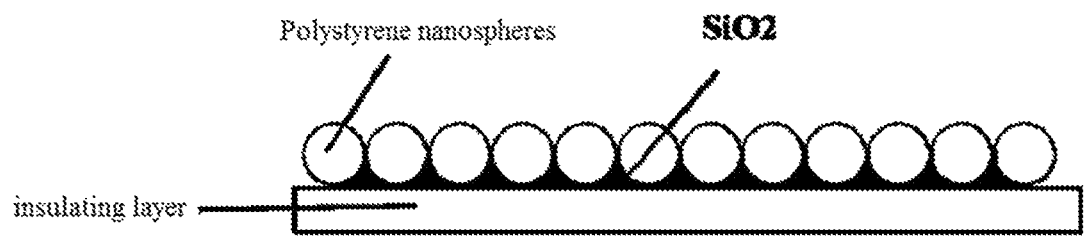
FIG. 3 is a single-layer Polystyrene nanospheres thin film formed in a fabricating process of a vertical light-emitting field effect transistor according to an embodiment 1 of the present application, wherein the Polystyrene nanospheres are rehearsed in a hexagonal close-packed shape.
Figure 4:
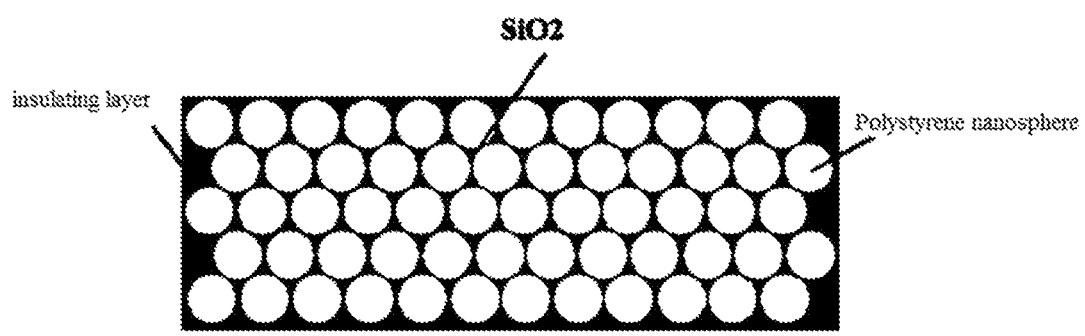
FIG. 4 is a top view of FIG. 3.

S13: fabricating a single-layer ordered nano-pit array structure on a surface of the insulating layer, the PS nanosphere-deionized water/ethanol suspension liquid may be selected to form a single-layer PS nanosphere thin film on the surface of the insulating layer through a liquid-gas interface self-organizing method, a spin-coating method, or the like, among then, the PS nanospheres are rehearsed in a hexagonal close-packed shape, and the thin film is single-layer nanospheres (as shown in FIGS. 3 and 4).

The fabricated nanosphere thin film can be further subjected to RIE etching process to reduce the size of the PS nanosphere to increase gaps between the nanospheres. Such as, using $O_2$ as the etching gas, and the gas flow rate is 5-100 sccm, then the etching is performed at power of 1-100 W for 1-500 s.

Figure 5:
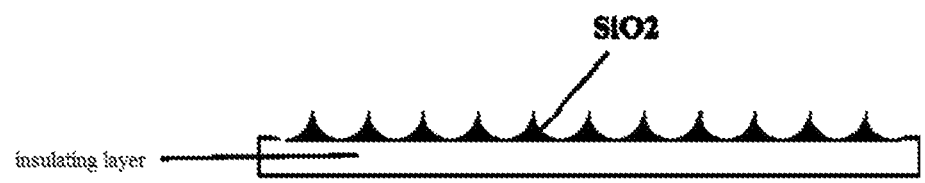
FIG. 5 is a view showing result of removing the Polystyrene nanospheres after annealing process in a fabricating process of a vertical light-emitting field effect transistor according to an embodiment 1 of the present application.

After drying the nanosphere thin film, immersing the PHPS solution in the gaps between PS nanospheres by solution-gel immersion method. Then performing an annealing process, and the annealing process is as follows: firstly, the formed coating is annealed at 50-100° C. for 1-60 min, this process mainly promotes the preliminary reaction of PHPS and promotes the evaporation of the solvent. Then it is annealed at 100-250° C. for 0.2~3 h, this process mainly promotes further condensation and hydrolysis of PHPS to form $SiO_2$ film, and promotes the volatilization of PS nanospheres under high temperature conditions to form nano-microstructures. During the annealing process, in order to promote the hydrolysis, condensation and solidification of PHPS, the environment can be set to a humid environment rich in water vapor, ammonia, and $H_2O_2$ and ultraviolet ozone cleaner (UVO) treatment to improve the efficiency of PHPS curing. After cooling in the annealing process, the device may be further placed in a tetrahydrofuran solution for immersion or ultrasonic process to remove residual PS nanospheres. Hexagonal close-packed $SiO_2$ film remains on the insulating layer (as shown in FIG. 5).

Figure 6:
FIG. 6 is a schematic view forming a nano-pit array structure on a surface of an insulating layer after an etching process in a fabricating process of a vertical light-emitting field effect transistor according to an embodiment 1 of the present application.

Using the above-mentioned $SiO_2$ generated in the gaps of the PS nanospheres as a mask to perform a wet etching to the insulating layer, the area covered by the PS nanospheres is the bare $Al_2O_3$ insulating layer, which can generate the nano-pit array structure during the reaction with the acidic solvent, the etched insulating layer is soaked or rinsed in HF acid to remove the remaining $SiO_2$; thereby forming a nano-pit array structure on the surface of the insulating layer (see FIG. 6).

S14: fabricating a second electrode on the insulating layer, the second electrode serves as the cathode or anode of the light-emitting unit and is also the source of the FET. The second electrode is a transparent electrode and can be fabricated by a solution method or a physical vapor deposition method; optionally, the material of the second electrode may be Argentum (Ag) nanowire or Ag nanosilver ink or a combination of both, and some metal oxides include: Indium Gallium Zinc Oxide (IGZO)/Zinc Oxide (ZnO)/ Indium Zinc Oxide (IZO)/WOx/VOx/Nickel Oxide(cas) (NiOx)/Cupric Oxide (CuO) and so on.

Specifically, a silver nanowire-ethanol suspension liquid with a concentration of 3 mg/mL is selected, and spin-coating at 800-6000 rpm for 60 s, and then annealing for 2 h after spin-coating to obtain a silver nanowire conductive layer; selecting the ink IGZO with a molar concentration of 0.1-0.5 M, preferably 0.1 M. The spin coating speed used ranges from 500-5000 rpm, preferably 3000 rpm; and the spin coating time ranges from 10-60 s, preferably 30 s. After spin coating, pre-annealing at 100-500° C. for 1-60 min, and continue post-annealing at 100-500° C. for 0.5-5 h. Among them, the pre-annealing temperature is preferably 300° C., and the annealing time is 5 min. The post-annealing temperature is 450° C. and the annealing time is 3 h to obtain the IGZO thin film electrode.

S15: depositing an electron (hole) injection layer, an electron (hole) transport layer, a light-emitting layer (organic light-emitting layer or quantum dot light-emitting layer), a hole (electron) transport layer, and a hole (electron) Injection layer and other functional layers.

Specifically, if the second electrode is a cathode, an electron injection layer and an electron transport layer are spin coated on the second electrode, and the electron transport layer is preferably n-type zinc oxide with high electron transport performance, and its preferred thickness ranges from 30-60 nm, the material of the electron injection layer can select low work function metals, such as, Ca, Ba and other, and CsF, LiF, $CsCO_3$ and other compounds, and other electrolyte type electron transport layer material.

If the second electrode is an anode, a hole injection layer and a hole transport layer are further spin-coated on the second electrode, which can be fabricated by using a hole transport or injection material commonly used in the art, and the hole injection layer and hole transport layer can be selected according to actual needs, such as PEDOT: PSS, TFB, etc. The thickness ranges from 0-100 nm, preferably 40-50 nm.

The light-emitting layer can be made of quantum dot materials or organic light-emitting materials commonly used in the art, and the thickness of the light-emitting layer is 10-100 nm.

S16: further fabricating a third electrode on the basis of the functional layer in step S15, if he third electrode is an anode, which can select high work function materials such as ITO, Au, Pt, Cr, and some alloys. If the third electrode is a cathode, which can select low work function materials such as Al, Ag, Ni, etc.

In summary, during the fabricating method of the integrated light-emitting device of the embodiment of the present application, except that the fabricating of the first electrode on the substrate is not a solution method, all other steps are solution fabricating methods, which can avoid different solvents interacting with each other and have the potential for low-cost, large-area manufacturing on various substrates.

The above are only preferred embodiments of the present application and are not intended to limit the present application. Any modification, equivalent replacement and improvement made within the spirit and principle of the present application should be included within the protection scope of the present application.

What is claimed is:

1. An integrated light-emitting device, comprising: a first electrode, an insulating layer, a second electrode, a light-emitting layer, and a third electrode which are sequentially laminated;
    wherein the first electrode, the insulating layer, the second electrode, and the third electrode together constitute a field effect transistor unit, and the first electrode, the second electrode and the third electrode are respectively a gate, a source and a drain of the field effect transistor unit, and a surface of the insulating layer adjacent to the second electrode is provided with a nano-pit array structure formed by removing a remaining $SiO_2$ and etching the insulating layer, and the nano-pit array structure is configured for condensing light and is concaved toward inside of the insulating layer; and
    the second electrode, the light-emitting layer and the third electrode together constitute a light-emitting unit, the light-emitting unit being configured to emit light toward the first electrode along the second electrode.

2. The integrated light-emitting device according to claim 1, wherein the nano-pit array structure is an ordered structure composed of nano-pits of a same size; or
    the nano-pit array structure is a disordered structure composed of nano-pits with different sizes.

3. The integrated light-emitting device according to claim 1, wherein a distribution density of nano-pits in the nano-pit array structure ranges from 1-100 per $\mu m^2$.

4. The integrated light-emitting device according to claim 1, wherein the insulating layer is an $Al_2O_3$ layer.

5. The integrated light-emitting device according to claim 1, wherein the insulating layer is composed of a Polyimide layer and an $Al_2O_3$ layer which are laminated.

6. The integrated light-emitting device according to claim 1, wherein the light-emitting layer is a quantum dot light-emitting layer or an organic light-emitting layer.

7. The integrated light-emitting device according to claim 1, wherein the second electrode is an anode, the third electrode is a cathode, and a hole functional layer is laminated between the second electrode and the light-emitting layer; and/or an electron functional layer is laminated between the light-emitting layer and the third electrode.

8. The integrated light-emitting device according to claim 7, wherein the hole functional layer comprises a hole transport layer or a hole injection layer and a hole transport layer which are sequentially laminated, and the electron functional layer comprises an electron transport layer or an electron transport layer and an electron injection layer which are sequentially laminated.

9. The integrated light-emitting device according to claim 1, wherein the second electrode is a cathode, the third electrode is an anode, and an electron functional layer is laminated between the second electrode and the light-emitting layer; and/or a hole functional layer is laminated between the light-emitting layer and the third electrode.

10. The integrated light-emitting device according to claim 9, wherein the electron functional layer comprises an electron transport layer or an electron injection layer and an electron transport layer which are sequentially laminated, and the hole functional layer comprises a hole transport layer or a hole transport layer and a hole injection layer which are sequentially laminated.

11. A fabricating method for an integrated light-emitting device, comprising following steps:
providing a substrate and fabricating a first electrode on the substrate;
fabricating an insulating layer on the first electrode;
fabricating a nano-pit array structure configured for condensing light on a surface of the insulating layer by removing a remaining $SiO_2$ and etching the insulating layer, wherein the nano-pit array structure is concaved toward inside of the insulating layer;
fabricating a second electrode on the insulating layer;
fabricating a light-emitting layer on the second electrode; and
fabricating a third electrode on the light-emitting layer;
wherein the first electrode, the insulating layer, the second electrode, and the third electrode together constitute a field effect transistor unit, and the second electrode, the light-emitting layer and the third electrode together constitute a light-emitting unit.

12. The fabricating method according to claim 11, wherein the step of fabricating an insulating layer on the first electrode comprises:
depositing a Polyimide solution on the first electrode and performing a first annealing process to obtain a Polyimide layer, then depositing an $Al_2O_3$ precursor solution on the Polyimide layer and performing a second annealing process to obtain an $Al_2O_3$ layer.

13. The fabricating method according to claim 11, wherein the step of fabricating an insulating layer on the first electrode comprises: depositing an $Al_2O_3$ precursor solution on the first electrode and performing a second annealing process to obtain an $Al_2O_3$ layer.

14. The fabricating method according to claim 11, wherein the step of fabricating a nano-pit array structure on the surface of the insulating layer comprises:
fabricating a Polystyrene nanosphere solution, and depositing the Polystyrene nanosphere solution on a surface of the insulating layer to obtain a single layer of Polystyrene nanospheres;
depositing a Perhydropolysilazane (PHPS) solution on the single-layer of Polystyrene nanospheres such that the Perhydropolysilazane (PHPS) solution is immersed in gaps of the single-layer Polystyrene nanospheres, and then performing a third annealing process to volatilize the single-layer Polystyrene nanospheres to obtain a $SiO_2$ film;
performing an etching process to the insulating layer by using the $SiO_2$ film as a mask, such that the nano-pit array structure is formed on the surface of the insulating layer.

15. The fabricating method according to claim 14, wherein prior to the step of depositing the Perhydropolysilazane (PHPS) solution on the single-layer of Polystyrene nanospheres, the fabricating method further comprises: performing a RIE etching process on the single-layer Polystyrene nanospheres; and/or
the step of the third annealing process further comprises: performing a ultraviolet ozone process in a gaseous environment of ammonia gas and hydrogen peroxide; and/or
after the step of the third annealing process, the method further comprises: a ultrasonic processing or an immersion processing with tetrahydrofuran solution.

16. The fabricating method according to claim 14, wherein the third annealing process comprises: annealing at 50-100° C. for 1-60 min, then annealing at 100-250° C. for 0.2-3 h.

17. The fabricating method according to claim 14, wherein the etching process comprises: by using the $SiO_2$ film as a mask, etching a bare material on the surface of the insulating layer with a first acidic solvent, and then removing the $SiO_2$ film with a second acidic solvent.

18. The fabricating method according to claim 14, wherein a diameter of Polystyrene nanospheres in the Polystyrene nanosphere solution range from 100-1000 nm.

19. The fabricating method according to claim 14, wherein a mass concentration of Polystyrene nanospheres in the Polystyrene nanosphere solution ranges from 0.2-5%; and/or
a mass concentration of Perhydropolysilazane (PHPS) in the Perhydropolysilazane (PHPS) solution ranges from 1-10%.

20. The fabricating method of claim 14, wherein Polystyrene nanospheres in the single-layer of Polystyrene nanospheres are rehearsed in a hexagonal close-packed shape.

* * * * *